United States Patent
Stevens et al.

(10) Patent No.: US 7,372,033 B1
(45) Date of Patent: May 13, 2008

(54) MULTI-SPECTRAL FILTERING

(75) Inventors: Rick C. Stevens, Apple Valley, MN (US); Allison Hernandez, St. Paul, MN (US); Firooz A. Sadjadi, St. Anthony, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 280 days.

(21) Appl. No.: 11/335,106

(22) Filed: Jan. 19, 2006

(51) Int. Cl.
 *G01J 1/04* (2006.01)
(52) U.S. Cl. .............................. 250/339.01
(58) Field of Classification Search ............ 250/338.1
 See application file for complete search history.

(56) References Cited

U.S. PATENT DOCUMENTS

| | | | |
|---|---|---|---|
| 4,413,324 A | 11/1983 | Tatsuwaki et al. | |
| 4,967,264 A | 10/1990 | Parulski et al. | |
| 5,822,222 A | 10/1998 | Kaplinsky et al. | |
| 7,019,333 B1 * | 3/2006 | Shields et al. | 257/97 |
| 7,148,492 B2 * | 12/2006 | Loney et al. | 250/458.1 |
| 2003/0016907 A1 | 1/2003 | LoCascio et al. | |
| 2005/0180680 A1 | 8/2005 | Kong | |
| 2006/0132901 A1 * | 6/2006 | Miller | 359/326 |
| 2006/0169971 A1 * | 8/2006 | Cho et al. | 257/14 |

* cited by examiner

*Primary Examiner*—David Porta
*Assistant Examiner*—David S Baker
(74) *Attorney, Agent, or Firm*—Brooks, Cameron & Huebsch, PLLC

(57) ABSTRACT

One device embodiment includes a device for filtering radiation from a target region in multiple spectral bands. The device includes a number of optical quantum dot filters, each having a particular pass-through wavelength range, positioned on a rotatable disk.

30 Claims, 3 Drawing Sheets

MULTI-SPECTRAL FILTERING

FIELD OF THE INVENTION

The present disclosure generally relates to object detection and recognition. And, in particular, the present disclosure relates to devices and systems for multi-spectral sensing using quantum dot filtering.

BACKGROUND

Multi-spectral and hyper-spectral sensors have been used for a variety of purposes. For example, these types of sensors may be used in a number of object recognition and detection applications for mapping, weather monitoring, precision agriculture, urban planning, and security systems, among other applications.

Multi-spectral and hyper-spectral sensors measure radiation emitted by a given surface or object as well as radiation reflected from the surface or object in a number of different narrow spectral bands. By obtaining images of the given surface or object in a number of different narrow spectral bands, various characteristics of the surface or object can be determined and/or discriminated, such as temperature, color, composition, etc.

Some multi-spectral sensors use multi-quantum-well (MQW) sensor arrays with a number of sensing regions whose sensor elements can be composed of layers of semiconductor material. The sensing regions can sense radiation in particular wavelength bands.

While having the ability to obtain image information of surfaces in multiple wavelength bands simultaneously, many multi-spectral and/or hyper-spectral sensors can be expensive to manufacture and/or have a larger size than is suitable for some applications.

Quantum mechanics are also utilized in other fields of technology. For example, quantum dots, also referred to as semiconductor nanocrystals, are materials whose size is on the order of the exciton Bohr radius of the material such that the electron energy levels can be treated as discrete, rather than continuous. The size of the band gap of these materials can be controlled by adjusting the size of the dot (e.g., by adding or subtracting atoms).

The ability to control the size of the band gap also allows for the ability to "tune" the absorption and/or fluorescence characteristics of each quantum dot. For example, quantum dots have tunable absorption onsets and emission patterns. That is, increasing or decreasing the size of a quantum dot and/or altering the type of quantum dot material can change the peak emission wavelength and/or the wavelength of the first exciton peak associated with a particular quantum dot.

Some examples of quantum dot materials include lead-selenide, lead-sulfide, lead-telluride, cadmium-selenide, and cadmium-sulfide, among others. These materials can be provided in various forms including thin films, resins, powders, or as particles, among other forms.

The ability to tune absorptive and fluorescence characteristics of quantum dot materials makes them useful in a number of filtering applications. For example, quantum dot thin film materials may be used as wavelength filters in waveguide structures of optical devices (e.g., in fiber optic media, etc.).

One example includes the use of quantum dots as a saturable absorber material in an add/drop filter within a fiber optic communication system. In this example, the quantum dot thin film material, sandwiched between two planar mirrors, allows for a specific wavelength within a particular wavelength band to be transmitted.

SUMMARY

Embodiments of the present disclosure provide devices, apparatuses, systems, and methods for multi-spectral sensing of a target region by using quantum dot filters to obtain radiation information of the target region in particular spectral bands.

For example, in various device embodiments of the present disclosure, a device for filtering radiation from a target region in multiple spectral bands includes a number of optical quantum dot filters, having particular pass-through wavelength ranges, positioned on a rotatable disk. The filters can include quantum dot thin film material that can be deposited on a substrate.

In some embodiments, the quantum dot material can be mixed with a host material and bonded, or adhered, to the substrate via screen printing, pulsed laser deposition, or other deposition methods. The quantum dot thin film material can include quantum dots formed of various materials. For example, quantum dots can be formed from materials including lead-selenide, lead-sulfide, lead-telluride, zinc-sulfide, cadmium-selenide, and cadmium-sulfide, among other materials.

The quantum dot materials utilized in the filters have absorptive and/or fluorescence characteristics that can be tunable (e.g., by altering the size and/or composition of the quantum dots) to a range of specific wavelengths. Such quantum dot materials can be manufactured so that the materials pass and/or absorb a number of radiation wavelengths. For example, in some embodiments, the quantum dot materials can be manufactured to pass radiation through the filter (i.e., pass-through) in one or more wavelength ranges (e.g., 10 nanometer bands, 100 nanometer bands, 200 nanometer bands, etc.).

For instance, a number of filters can be designed to pass discrete 100 nanometer bands in a wavelength range between 700 and 1700 nanometers. This range and size of discrete bands is shown merely as an example and any range and filter pass-through range can be used in the various embodiments.

In some embodiments, the particular pass-through wavelength ranges of the quantum dot filters can be substantially contiguous. That is, the pass-through wavelength ranges of the filters are substantially continuous over a broader range of wavelengths. For example, a first filter can have a pass-through wavelength range from about 700-800 nanometers, a second filter can have a pass-through wavelength range from about 800-900 nanometers, a third filter can have a pass-through wavelength range from about 900-1000 nanometers, etc. In this example, the contiguous ranges cover a broader wavelength range of about 1000 nanometers.

In some embodiments, the particular pass-through wavelength range of each of the quantum dot filters is centered around a different wavelength. For example, a first filter can be centered around 650 nanometers and a second filter can be centered around 750 nanometers.

The various filters can be positioned in front of a sensor array in a variety of ways. For example, in some embodiments of the present disclosure, the rotatable disk can be the substrate. That is, a number of quantum dot thin films can be deposited on various segments, or the entire, rotatable disk.

Various embodiments of the present disclosure include means for rotating the disk. The rotating means can be used to sequentially position the quantum dot filters for receiving radiation from the target region. That is, the disk can be rotated such that only one filter at a time receives radiation from the target region.

In various embodiments of the present disclosure, an apparatus for obtaining radiation information of a target region in particular wavelength ranges (i.e., spectral bands) includes a filter mechanism with a number of filters, comprised of quantum dot thin film material, positioned thereon. Each filter has a particular pass-through wavelength range and filters radiation received from the target region.

In some embodiments, the filter mechanism is a rotatable disk containing the number of filters as described above. In other embodiments, the filter mechanism can be a series of separate filters, a number of reciprocating sheets passing back and forth in front of the sensor array, or a continuous loop of material, for example.

In various embodiments, the apparatus can include a sensor array that has a wavelength responsivity range sensitive to the pass-through wavelength ranges and receives the filtered radiation passing through at least one of the filters. In some embodiments, the apparatus can include a logic component for synchronization between radiation received by the sensor array and filter position.

The synchronization component can signal the sensor array regarding the pass-through wavelength range presently passing through a filter. This information can be used to identify one or more characteristics of the target region.

In some embodiments, the apparatus can include a logic component that can identify a particular wavelength based upon a received signal from a sensor element of the sensor array. That is, each sensor of the sensor array can signal the logic component regarding the particular pass-through wavelengths received.

As mentioned above, the particular pass-through wavelength ranges of the filters can be substantially contiguous over a broader range of wavelengths. In some embodiments, the pass-through wavelength ranges of the filters are substantially contiguous over at least a portion of the wavelength responsivity range of the sensor array.

In one example embodiment, the optical responsivity range of the sensor array is from about 700 nanometers to about 1700 nanometers. In this example, a filter mechanism that includes ten filters can have contiguous 100 nanometer pass-through wavelength ranges over the 1000 nanometer wavelength responsivity range (700-1700 nanometers). That is, each of the ten filters passes a different 100 nanometer wavelength range, within the responsivity range, through to the sensor.

In some embodiments, the radiation passing through the filters can be used to form an image of the target region based upon the information from the sensor array. In those embodiments, the apparatus can include means for storing the image of the target region for determining a characteristic of a target or the target region.

The storage means can include volatile and/or non-volatile memory (e.g., RAM, ROM, hard disk, flash memory, etc.). The memory can reside on a processing component that can include a processor and other logic circuitry, executable instructions, etc. A characteristic of the region may include the color, the temperature, or the chemical composition of an object and/or surface in the target region, among other characteristics.

In various embodiments of the present disclosure, a system embodiment can be used for multi-spectral sensing of a target region. The system can include a number of filters that each has an associated range of pass-through wavelengths. In various embodiments, at least one of the filters is a quantum dot filter.

As mentioned above, the quantum dot filters can comprise a quantum dot thin film material formed in a variety of manners as described in more detail herein. For example, the materials can be screen-printed on a substrate.

In some embodiments, the quantum dots can include a shell comprising various materials (e.g., zinc-sulfide and cadmium-sulfide among other materials). Coating a quantum dot with a shell can affect the quantum dot in various manners including neutralizing surface defects, increasing quantum yield, and reducing non-radiative recombination, among other effects.

The system can include a component that directs radiation from the target region onto a sensor array that is positioned to receive the filtered radiation from the target region. As discussed, the sensor array can sense a number of characteristics of the target region by sensing a number of wavelength ranges (e.g., the various pass-through wavelength ranges of the filters). The component that directs radiation from the target region onto the sensor array can be a lens, mirror, and/or other optical component.

The sensor array can be any type of array used to identify a wavelength or receive radiation. For example, the sensor array can include charge coupled device (CCD) array, focal plane array (FPA), complimentary metal-oxide semiconductor (CMOS) array, and/or other such elements.

The system can position the filters to filter radiation received from the target region. The positioning of the filters can be accomplished by a rotatable or reciprocating mechanism and a motor, for example. These mechanisms can be used with a wheel, disk, or one or more strips or pieces of material that include the filter to position the filters in front of the array. In various embodiments, the system is designed such that the radiation received to the sensor array from the target region passes through a number of the filters, one at a time.

In various embodiments, the filters are located between the sensor array and the mechanism that directs radiation from the target region onto the sensor array. In some embodiments, the directing mechanism is located between the filters and the sensor array.

The filtered radiation from the target region received by the sensor array can be in the specific wavelength ranges associated with the absorptive and/or fluorescence characteristics of the quantum dot filters. For example, the radiation passing through each of the filters can be in a different 100 nanometer wavelength range.

The system can include one or more storage components that can be used to store sensor information received from the sensor array regarding the target region. As previously mentioned, the storage components can include memory of various types.

The sensor information can be organized in the wavelength ranges passed through the one or more filters and can be used to determine characteristics of the target region (e.g., color, temperature, chemical composition, etc.). As stated above, in various embodiments of the present disclosure, the wavelength ranges passed through the quantum dot filters can be substantially contiguous over a given range (e.g., over a given wavelength responsivity range of the sensor array).

DETAILED DESCRIPTION

The present disclosure includes a number of device, apparatus, system, and method embodiments for multi-spectral filtering of a target region by using quantum dot filtering. Embodiments of the present disclosure will now be described in relation to the accompanying drawings, which will at least assist in illustrating the various features of the various embodiments.

Figure 1:
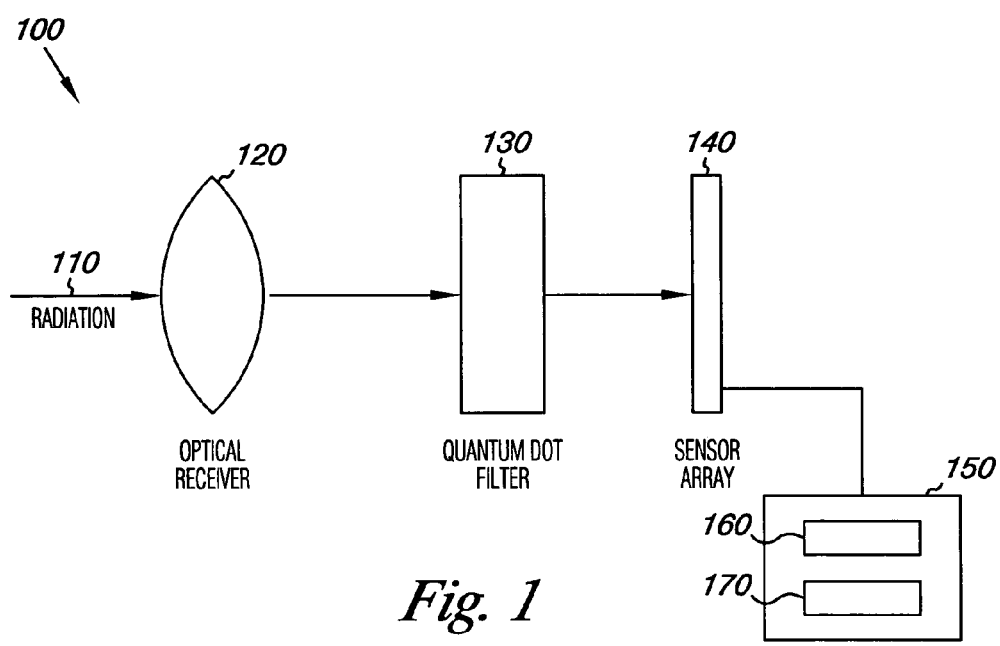
FIG. 1 is an illustration of a system embodiment for multi-spectral sensing of a target region including a quantum dot filter device embodiment.

FIG. 1 is an illustration of a system for multi-spectral sensing (i.e., sensing a number of wavelengths of radiation) of a target region including a quantum dot filter device according to an embodiment of the present disclosure. In the embodiment illustrated in FIG. 1, a system for multi-spectral sensing 100 generally includes an optical receiver 120 for receiving radiation 110 from a target region, a quantum dot filter 130, a sensor array 140, and a processing component 150 that can contain logic circuitry. In this embodiment, the processing component 150 includes a processor 160 and storage component 170 (e.g., memory).

As used herein, radiation 110 refers to electromagnetic radiation emitted and/or reflected from a target region. For example, radiation can include visible, ultraviolet, and/or infrared wavelengths of light, among other forms of radiation.

Also, as used herein, a target region refers to a region for which multi-spectral information is sought and may include a number of objects and/or surfaces. Multi-spectral information of a target region refers to radiation information of a given region that can be determined through the filtering of two or more spectral bands.

In the embodiment of FIG. 1, radiation 110 is received by optical receiver 120 and directed onto sensor array 140 through quantum dot filter 130. As discussed above, the sensor array 140 can include focal plane array (FPA), charge coupled device (CCD) array, complimentary metal-oxide semiconductor (CMOS) array, or other such elements. The array elements can provide an electrical output based on the radiation received.

The sensor array 140 can have various wavelength responsivities depending on the type of array, composition of array elements, etc. For example, a two-dimensional Indium Gallium Arsenide array can have a responsivity from about 700 to 1700 nanometers. However, embodiments of the present disclosure are not limited to a particular sensor array type or wavelength responsivity range.

The quantum dot filter device 130 can include a number of quantum dot filters for filtering target radiation 110 in multiple spectral bands (i.e., wavelength ranges). The quantum dot filters of device 130 can be positioned to filter radiation 110 one after another as discussed in greater detail in connection with the embodiments of FIGS. 2A-3.

That is, a first filter of component 130 can be positioned to filter radiation 110 to be received by sensor array 140. A second filter of component 130 can then be positioned to filter radiation 110 to be received by sensor array 140, followed by a third filter of component 130, etc.

Therefore, it is possible to customize a filter 130 such that the pass-through wavelength ranges of its quantum dot filters are substantially contiguous over a broader range of wavelengths. For example, a first quantum dot filter of component 130 can have a pass-through wavelength range from 700-800 nanometers, a second quantum dot filter of component 130 can have a pass-through wavelength range from 800-900 nanometers, a third quantum dot filter of component 130 can have a pass-through wavelength range from 900-1000 nanometers, etc.

Embodiments are not limited to these examples and, in some embodiments, the wavelength ranges can overlap or have gaps from one to the next. For example, cross-checking through the use of multiple filters can be implemented or in some embodiments, all wavelengths in a broad range may not be useful in determining a characteristic to be analyzed. Filter component 130 can, in some embodiments, include quantum dot filters that have different sized pass-through wavelength ranges (e.g., 10 nanometers, 50 nanometers, 100, nanometers, 200 nanometers, etc.) as well as quantum dot filters covering various different wavelength ranges (e.g., 775-850 nanometers, 900-1050 nanometers, 1400-1600 nanometers, etc.).

As mentioned above, a sensor array has an associated wavelength responsivity range, which corresponds to the range of wavelengths for which the particular array is designed to sense. The responsivity range of various sensors can depend on various factors including the composition of the sensor elements. For example, Indium Gallium Arsenide arrays can have a responsivity range from about 750-1700 nanometers, while various Silicon arrays can have narrower responsivity ranges (e.g., 750-1100 nanometers).

In some embodiments, the radiation information 110 can be received by the sensor elements (e.g., pixels) of the sensor array 140. The sensor elements of sensor array 140 receive a charge based on the wavelength of the radiation received to the particular sensor element.

Logic circuitry can convert the charge of each sensor element into a signal that corresponds to the wavelength of the radiation received to the sensor element. Therefore, the signals from the various sensor elements of sensor array 140 can provide radiation information in the form of an image of the target region. As discussed herein, the radiation information received by sensor array 140 can then be used to determine one or more characteristics of the target region (e.g., in the form of images in various wavelength ranges that correspond to the pass-through wavelength ranges of the quantum dot filters or as wavelength information that can be correlated with characteristics of typical targets, target areas, friendly vehicles, or structures, among other characteristics. Such information can be stored locally or remotely and can be correlated using logic circuitry, e.g., a processor, either locally or remotely).

The radiation information 110 received by sensor array 140 from a target region can be stored on storage component 170. Storage component 170 can reside, partially or wholly, on processing component 150 and/or can be an independent system component. Storage component 170 can include one or more memory types (e.g., RAM, ROM, disk, flash memory, etc.).

Storage component 170 can also store executable instructions for receiving information (e.g., image information from sensor array 140), manipulating the information, and/or sending the information, among other functions. The processing component 150 can include one or more processors (e.g., processor 160) and/or other logic circuitry that can be used to execute instructions (e.g., executable instructions stored on storage component 170).

The radiation information 110 received by sensor array 140 and storable on storage component 170 can be organized in a number of wavelength ranges and can be used to determine a characteristic of the target region. For example, the radiation information 110 from a target region can be filtered by each of a number of filters of filter component 130 and directed onto sensor array 140 via optical receiver 120.

The radiation 110 received by sensor array 140 through each filter can provide information regarding the target region in the particular pass-through wavelength range of the filter (e.g., an image of the target region in each pass-through wavelength range can be received by sensor array 140 and can be stored on storage component 170 as discussed above). In this manner, information regarding a particular target region based upon the wavelength ranges utilized (i.e., spectral information) can be obtained. This spectral information can be used for a variety of object detection and/or recognition purposes.

In the embodiment of FIG. 1, the filter 130 is shown as being between optical receiver 120 and sensor array 140. However, filter 130 can be positioned such that optical receiver 120 is between filter 130 and sensor array 140. Furthermore, filter 130 can be positioned at various distances from optical receiver 120 and sensor array 140.

Various embodiments of a system for multi-spectral sensing of a target region can include more or less components than are shown in the embodiment of FIG. 1. For example, embodiments of a multi-spectral sensing system can include one or more additional optical receivers, quantum dot filters, sensor arrays, and/or processing components.

Figure 2A:
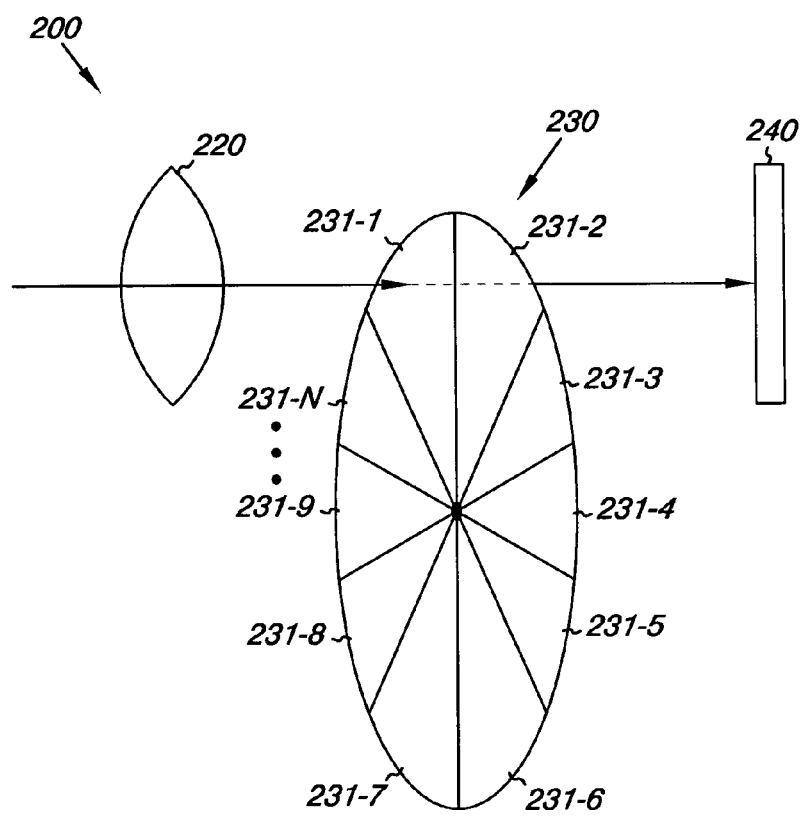
FIG. 2A is an illustration of a system embodiment including an embodiment of a quantum dot filter device for filtering radiation from a target region in multiple spectral bands.

FIG. 2A is an illustration of an embodiment of a system 200 including an embodiment of a quantum dot filter component 230 for filtering radiation from a target region in multiple spectral bands. System 200 includes a mechanism to direct radiation 220 received from a target region onto a sensor array 240 through quantum dot filter component 230.

Quantum dot filter component 230 comprises a number of filters 231-1, 231-2, 231-3, 231-4, 231-5, 231-6, 231-7, 231-8, 231-9, . . . , 231-N positioned on a rotatable disk. The designator "N" is used to indicate that filter device 230 can include any number of filters. As mentioned above, one or more of filters 231-1, 231-2, 231-3, 231-4, 231-5, 231-6, 231-7, 231-8, 231-9, . . . , 231-N can comprise a quantum dot thin film material.

As shown in FIG. 2A, each filter 231-1, 231-2, 231-3, 231-4, 231-5, 231-6, 231-7, 231-8, 231-9, . . . , 231-N occupies a distinct region of the rotatable disk. The disk can be rotated about an axis such that the filtering material on each region 231-1, 231-2, 231-3, 231-4, 231-5, 231-6, 231-7, 231-8, 231-9, . . . , 231-N filters radiation from the target region, one at a time. For example, the embodiment of FIG. 2A shows filter 231-1 filtering target radiation received from a target region. As the reader will appreciate, the filter component 230 can be rotated such that the target radiation is filtered by each of the filters 231-1, 231-2, 231-3, 231-4, 231-5, 231-6, 231-7, 231-8, 231-9, . . . , 231-N.

As mentioned above, quantum dot filters can be manufactured such that they have particular pass-through wavelength bands. Therefore, the filters 231-1, 231-2, 231-3, 231-4, 231-5, 231-6, 231-7, 231-8, 231-9, . . . , 231-N positioned on filtering component 230 can each allow radiation to pass through in a different spectral band.

As mentioned in an example above, ten filters can be positioned on a filtering component (e.g., filtering component 230), each allowing radiation in a different 100 nanometer band to pass through (e.g., to sensor array 240). Thus, this example filter component can be used to obtain spectral information of a target region in 10 different wavelength ranges. As described in connection with the embodiment of FIG. 2A, the spectral information can be stored and used to determine characteristics of the target region.

Various other configurations of the filters 231-1, 231-2, 231-3, 231-4, 231-5, 231-6, 231-7, 231-8, 231-9, . . . , 231-N are contemplated according to embodiments of the present disclosure. For example, the filters can have various shapes (e.g., circular, rectangular, hexagonal, etc.) and can be placed in apertures of the disk's surface.

In some embodiments, the filter component can be a substrate to which quantum dot thin film material is deposited in discrete sections, such as the sections 231-1, 231-2, 231-3, 231-4, 231-5, 231-6, 231-7, 231-8, 231-9, . . . , 231-N shown on filter component 230 of the embodiment of FIG. 2A. The quantum dot thin film material can be deposited on the filter component via screen-printing or other deposition methods. In some embodiments, the quantum dot thin film material can form the filter component.

Figure 2B:
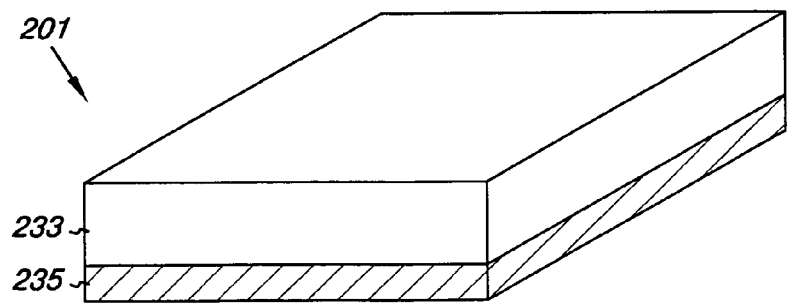
FIG. 2B is an illustration of a quantum dot thin film filter embodiment.

FIG. 2B is an illustration of a quantum dot thin film filter 201 according to an embodiment of the present disclosure. Filter 201 includes a quantum dot thin film layer 233 and a substrate layer 235. Quantum dot thin film layer 233 can be deposited on substrate 235 by various methods (e.g., screen-printing, pulsed laser deposition, spin-coating, or other deposition methods).

The quantum dot thin film layer comprises quantum dots and can be mixed with an appropriate host substance. The host substance can be material that is transparent to various wavelengths. Such suitable materials can be visually transparent, semi-transparent, or opaque, but can be transparent to certain wavelengths of radiation. Examples include glass, plastic, and various semiconductor materials.

A host substance can be used to aid in adhering layer 233 to substrate 235. Such host substances can include epoxies, glues, thermo set, and/or chemical set substances, among others.

The substrate 235 can be made of any suitable material. Examples include silicon, glass, plastic, or other suitable substrate materials.

Figure 3:
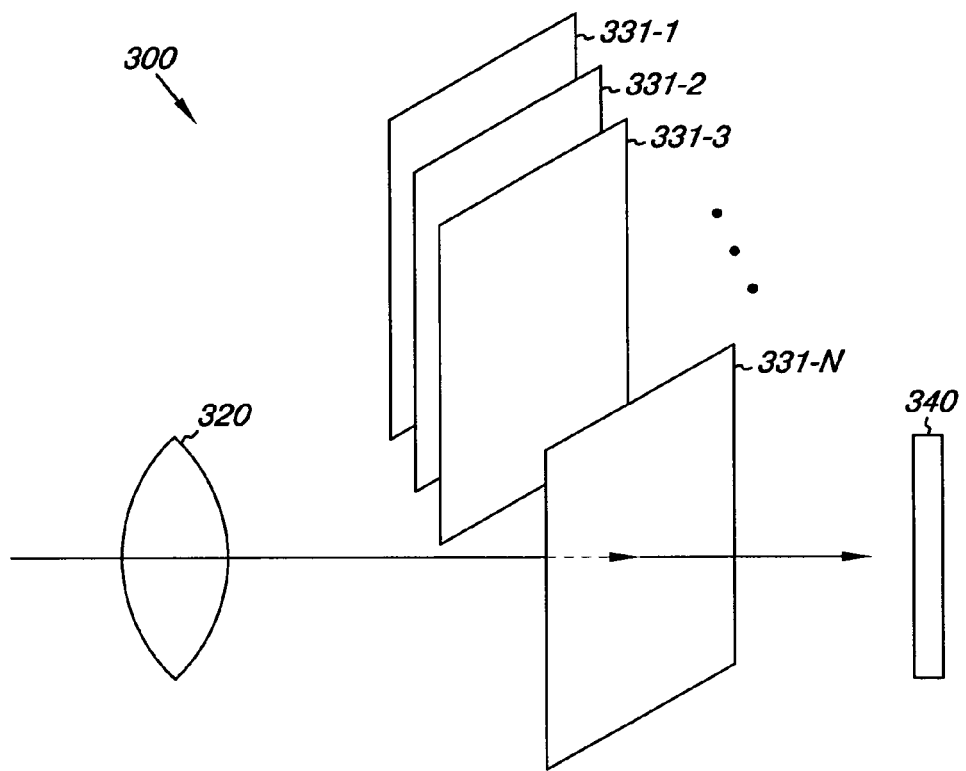
FIG. 3 is an illustration of a system embodiment including an embodiment of a quantum dot filtering mechanism according to an embodiment of the present disclosure.

FIG. 3 is an illustration of a system embodiment 300 including an embodiment of a quantum dot filtering mechanism according to an embodiment of the present disclosure. System 300 includes a mechanism that directs radiation 320 received from a target region through various quantum dot filters (e.g., 331-1, 331-2, 331-3, . . . , 331-N) onto a sensor array 340.

As mentioned above, the quantum dot filters 331-1, 331-2, 331-3, . . . , 331-N can have particular absorptive and/or fluorescence characteristics such that they can filter radiation in various pass-through wavelength ranges.

The filters 331-1, 331-2, 331-3, . . . , 331-N can be individually positioned to filter the received radiation. In the embodiment of FIG. 3, filter 331-N is the filter presently receiving the radiation from the target region. The system 300 can operate to replace filter 331-N with one or more of the other filters 331-1, 331-2, 331-3, . . . , 331-N. In this manner, radiation of the target region can be received by sensor array 340 and sensed by it in the particular pass-through wavelength ranges of the number of filters.

It is noted that the filters 331-1, 331-2, 331-3, . . . , 331-N can assume various shapes and sizes other than those in the embodiment of FIG. 3. For example, the filters 331-1, 331-2, 331-3, . . . , 331-N can be circular, oval, and hexagonal, among other shapes.

Although specific embodiments have been illustrated and described herein, those of ordinary skill in the art will appreciate that any arrangement calculated to achieve the same techniques can be substituted for the specific embodiments shown. This disclosure is intended to cover adaptations or variations of various embodiments of the disclosure. It is to be understood that the above description has been made in an illustrative fashion, and not a restrictive one.

Combination of the above embodiments, and other embodiments not specifically described herein will be apparent to those of ordinary skill in the art upon reviewing the above description. The scope of the various embodiments of the disclosure includes various other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the disclosure include more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separate embodiment.

What is claimed:

1. A device for filtering radiation from a target region in multiple spectral bands, comprising:
    a rotatable disk;
    a number of optical quantum dot filters, wherein each of the number of optical quantum dot filters is positioned on the rotatable disk, and wherein each of the number of optical quantum dot filters positioned on the rotatable disk has a particular pass-through wavelength range.

2. The device of claim 1, wherein each of the number of optical quantum dot filters comprises a quantum dot thin film material deposited on a substrate.

3. The device of claim 2, wherein the quantum dot thin film material includes a host substance.

4. The device of claim 2, wherein the particular pass-through wavelength ranges of the number of optical quantum dot filters are substantially contiguous wavelength ranges.

5. The device of claim 2, wherein the rotatable disk is the substrate.

6. The device of claim 3, wherein the quantum dot thin film material is a screen printed material on the substrate.

7. The device of claim 4, wherein the pass-through wavelength ranges associated with the number of optical quantum dot filters positioned on the rotatable disk each has a wavelength range that is centered around a different wavelength.

8. The device of claim 4, wherein the device includes means for rotating the rotatable disk to sequentially position the number of optical quantum dot filters in front of a sensor array, one at a time, for receiving radiation from the target region.

9. The device of claim 6, wherein the quantum dot thin film material includes quantum dots comprising material selected from the group including:
    lead-selenide;
    lead-sulfide;
    lead-telluride;
    zinc-sulfide;
    cadmium-selenide; and
    cadmium-sulfide.

10. An apparatus for obtaining radiation information of a target region in particular wavelength ranges, comprising:
    a filter mechanism;
    a number of filters comprised of a quantum dot thin film material positioned on the filter mechanism, wherein each filter has a particular pass-through wavelength range and filters radiation received from the target region; and
    a sensor array having a wavelength responsivity range sensitive to the pass-through wavelength ranges of the number of filters, wherein the sensor array receives the radiation passing through at least one of the number of filters.

11. The apparatus of claim 10, including a logic component for synchronization between radiation received and a filter position.

12. The apparatus of claim 10, including a logic component that identifies a wavelength based upon a received signal from a sensor of the sensor array.

13. The apparatus of claim 10, wherein the sensor array is spaced a predetermined distance from the number of optical filters.

14. The apparatus of claim 10, wherein the particular pass-through wavelength ranges of the number of filters are substantially contiguous over at least a portion of the wavelength responsivity range of the sensor array.

15. The apparatus of claim 10, wherein the radiation passing through the at least one of the number of filters and received to the sensor array forms an image of the target region on the sensor array.

16. The apparatus of claim 15, including means for storing the image of the target region for determining a characteristic of the target region.

17. A system for multi-spectral sensing of a target region, comprising:
    a plurality of filters, wherein each filter has an associated pass-through wavelength range, and wherein one or more of the plurality of filters is a quantum dot filter;
    means for positioning a number of the plurality of filters to filter radiation received from the target region;
    means for directing radiation from the target region onto a sensor array for sensing a number of characteristics of the target region by sensing a number of pass-through wavelength ranges,
    wherein the sensor array is positioned to receive radiation from the target region filtered by the number of the plurality of filters; and
    means for storing sensor information received from the sensor array regarding the target region, wherein the sensor information is organized as a number of pass-through wavelength ranges for determining a characteristic of the number of characteristics of the target region.

18. The system of claim 17, wherein the one or more quantum dot filters comprise a quantum dot film material formed on a substrate.

19. The system of claim 18, wherein the quantum dot film material is a screen-printed material on the substrate.

20. The system of claim 17, wherein the number of pass-through wavelength ranges are substantially contiguous over at least a portion of a wavelength responsivity range of the sensor array.

21. The system of claim 17, wherein the means for positioning includes a rotating disk that includes the plurality of filters.

22. The system of claim 17, wherein the system includes means for directing is positioned between the photo sensor array and the plurality of optical filters.

23. The system of claim 17, wherein each of the number of pass-through wavelength ranges is within the wavelength responsivity range of the sensor array.

24. The system of claim 17, wherein the sensor array is selected from the group including:
   a focal plane array;
   a charge coupled device array; and
   a complimentary metal-oxide semiconductor array.

25. The system of claim 17, wherein one or more of the quantum dot filters include quantum dots having a shell comprising a material selected from the group including:
   zinc-sulfide; and
   cadmium-sulfide.

26. The system of claim 17, wherein the characteristic of the target region is selected from the group including:
   a temperature of the target region;
   a color of one or more objects in the target region; and
   the chemical composition of one or more objects in the target region.

27. A method for filtering radiation from a target region in multiple spectral bands, comprising:
   providing a number of quantum dot filters that include a screen printed thin film material comprising quantum dots and a host substance, wherein the number of quantum dot filters reside on a filter mechanism;
   positioning one or more of the number of quantum dot filters between a sensor array and an optical receiver, by using the filter mechanism, to receive radiation from the target region; and
   directing the radiation received from the target region onto the sensor array through the one or more quantum dot filters by using the optical receiver, wherein each quantum dot filter allows radiation to pass through in a particular wavelength range.

28. The method of claim 27, wherein the method includes providing the number of quantum dot filters that further include the screen printed thin film material deposited on a substrate.

29. The method of claim 27, wherein the method includes positioning the quantum dot filters on a filter wheel.

30. The method of claim 29, wherein the method includes rotating the filter wheel such that the radiation received from the target region is directed through one quantum dot filter at a time.

* * * * *